(12) United States Patent
Higgins, III et al.

(10) Patent No.: US 9,461,009 B1
(45) Date of Patent: Oct. 4, 2016

(54) METHOD AND APPARATUS FOR ASSEMBLING A SEMICONDUCTOR PACKAGE

(71) Applicant: FREESCALE SEMICONDUCTOR, INC., Austin, TX (US)

(72) Inventors: Leo M. Higgins, III, Austin, TX (US); Glenn G. Daves, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/722,810

(22) Filed: May 27, 2015

(51) Int. Cl.
| | | |
|---|---|---|
| *H01L 23/52* | (2006.01) | |
| *H01L 23/00* | (2006.01) | |
| *H01L 21/56* | (2006.01) | |
| *H01L 23/29* | (2006.01) | |
| *H01L 23/31* | (2006.01) | |
| *H01L 21/768* | (2006.01) | |

(52) U.S. Cl.
CPC .............. *H01L 24/14* (2013.01); *H01L 21/568* (2013.01); *H01L 21/76829* (2013.01); *H01L 23/293* (2013.01); *H01L 23/3171* (2013.01); *H01L 24/11* (2013.01); *H01L 24/46* (2013.01); *H01L 2224/1134* (2013.01); *H01L 2224/45124* (2013.01); *H01L 2224/45139* (2013.01); *H01L 2224/45144* (2013.01); *H01L 2224/45147* (2013.01); *H01L 2224/45565* (2013.01); *H01L 2224/48465* (2013.01)

(58) Field of Classification Search
CPC ................ H01L 24/14; H01L 21/568; H01L 21/76829; H01L 23/293; H01L 23/3171; H01L 24/11; H01L 24/46; H01L 2224/1134; H01L 2224/45124; H01L 2224/45139; H01L 2224/45144; H01L 2224/45147; H01L 2224/45565
USPC ........................................................ 257/738
See application file for complete search history.

(56) References Cited

U.S. PATENT DOCUMENTS

| | | | | |
|---|---|---|---|---|
| 7,160,755 B2* | 1/2007 | Lo | ........................ | H01L 21/4821 257/737 |
| 7,432,130 B2* | 10/2008 | Ismail | .................... | H01L 21/568 257/778 |
| 7,727,858 B2* | 6/2010 | Kinsman | ............... | H01L 21/561 438/455 |
| 7,749,809 B2* | 7/2010 | How | ..................... | H01L 21/568 257/E23.006 |
| 7,982,305 B1 | 7/2011 | Railkar et al. | | |
| 8,330,260 B2* | 12/2012 | Bauer | .................... | H01L 21/561 257/678 |
| 8,513,799 B2* | 8/2013 | Fjelstad | ............ | H01L 23/49811 257/692 |
| 8,810,045 B2* | 8/2014 | Ho | ..................... | H01L 23/49827 257/691 |
| 9,034,694 B1 | 5/2015 | Kalandar et al. | | |
| 2006/0226534 A1* | 10/2006 | Liang | ..................... | H01L 24/29 257/698 |
| 2013/0127044 A1* | 5/2013 | Poddar | .................... | H01L 24/97 257/737 |
| 2014/0167262 A1 | 6/2014 | Yap | | |

OTHER PUBLICATIONS

Hart, "Improved PCB circuit design by Co-designing chips with User Definable Pinouts", pp. 1-5, Mirror Semiconductor, Inc.
Bilotta, "Multiwire", "Connections in Electronic Assemblies", 1985, pp. 89-94, CRC Press, <<https://books.google.com/books?id=nTDdc0WjApMC&pg=PA89&lpg=PA89&dq=multiwire+wire+wrap+boards&source=bl&ots=ob1MxJa2Zb&sig=Gfjz32sHrPCenrEd1OMqsb9Av2Y&hl=en&sa=X&ei=ygXAVKevGo6zyATppYGwBw&ved=0CE4Q6AEwCg#v=onepage&q=multiwire%20wire%20wrap%20boards&f=false>>.

* cited by examiner

Primary Examiner — Tod T Van Roy
Assistant Examiner — Vu A Vu

(57) ABSTRACT

A method of packaging a semiconductor device is described. The method includes: attaching a first surface of a semiconductor die to a carrier; forming one or more first stud bumps on the carrier; using bond wires, electrically connecting one or more locations on a second surface of the semiconductor die to one or more first stud bumps; molding the semiconductor die, the first stud bumps, and the bond wires in an encapsulation material; removing the carrier from the bottom side of the semiconductor package exposing a portion of the first stud bumps; and attaching one or more solder balls to the exposed portion of the first stud bumps.

20 Claims, 7 Drawing Sheets

METHOD AND APPARATUS FOR ASSEMBLING A SEMICONDUCTOR PACKAGE

BACKGROUND

1. Field

This disclosure relates generally to semiconductor packaging, and more specifically, to a method and apparatus for assembling a semiconductor package.

2. Related Art

Semiconductor device packaging is used to enclose and protect one or more semiconductor die as well as provide a way to connect the semiconductor die to a printed circuit board. There are many different types of semiconductor device packaging. A substrate is used in many of those types to support the die, provide conductive interconnects, and to provide heat dissipation. However, the complexity of a substrate used in today's semiconductor packages can add significant cost to the packaged semiconductor device.

Therefore, a need exists for a semiconductor device package and a method of packaging a semiconductor device that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
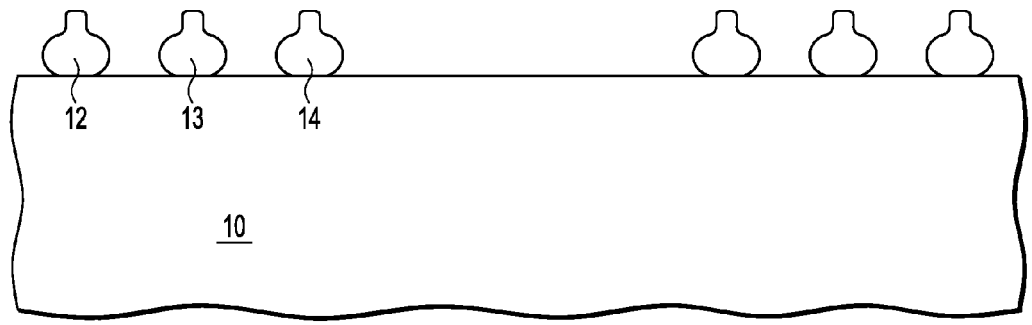
FIG. 1 through FIG. 5 illustrate a method for assembling a semiconductor package in accordance with an embodiment.

Generally, there is provided, a method of packaging and a packaged semiconductor device, that includes a semiconductor die and wire bonds that function as interconnects between the semiconductor die and terminal contacts. In one embodiment, a substrate is not included in the packaged semiconductor device. The semiconductor die is embedded with the wire bonds in an encapsulant and a substrate is not used. The encapsulant and wire bonds provide the interconnect and structure for the packaged semiconductor device. Wire bond studs are used to form anchor points, or terminations for wire bond connections, and for forming solder balls. The method provides a relatively low cost packaging technique that does not require the use of lithography or a multi-layer substrate.

In one embodiment, there is provided, a method of assembling a semiconductor package, the method comprising: attaching a first surface of a semiconductor die to a carrier; forming one or more first stud bumps on the carrier; using bond wires, electrically connecting one or more locations on a second surface of the semiconductor die to one or more first stud bumps; molding the semiconductor die, the first stud bumps, and the bond wires in an encapsulation material; removing the carrier from the bottom side of the semiconductor package exposing a portion of the first stud bumps; and attaching one or more solder balls to the exposed portion of the first stud bumps. Removing the carrier may include etching the carrier, grinding the carrier, or peeling the carrier. The encapsulation material may be a semiconductor epoxy mold compound. The method may further comprise electrically connecting two first stud bumps to each other using a bond wire. The carrier plate may include a metallic material or a polymer material. The bond wires may include a copper material, a gold material, a silver material, or an aluminum material. The bond wires may be insulator coated bond wires. The bond wires may include a ball bond on a first end and a stitch bond on a second end. Attaching the first surface of the semiconductor die to the carrier may include applying a die attach paste material to the carrier or a die attach film to the first surface of the semiconductor die.

In another embodiment, there is provided, a method of assembling a semiconductor package, the method comprising: attaching a first surface of a semiconductor die to a carrier; forming one or more first stud bumps on the carrier; forming one or more second stud bumps on a second surface of the semiconductor die; molding the semiconductor die and the first and second stud bumps in a first encapsulation material; exposing a portion of the first and second stud bumps through the first encapsulation material; using bond wires, electrically connecting the exposed portion of one or more first stud bumps to the exposed portion of one or more second stud bumps; forming a third stud bump on top of one or more bond wire ends; molding the bond wires and third stud bumps in a second encapsulation material; exposing a portion of the third stud bumps through the second encapsulation material; and attaching one or more solder balls to the exposed portion of the third stud bumps. The diameter of the third stud bumps may be equal to or greater than the diameter of the second stud bumps. Attaching the one or more solder balls may further comprise plating the exposed portion of the third stud bumps before attaching the one or more solder balls. Exposing a portion of the first and second stud bumps through the first encapsulation material may further comprise grinding the encapsulant until a predetermined diameter of the first and second stud bumps is exposed. Exposing a portion of the third stud bumps through the second encapsulation material may comprise using a film-assisted molding technique. The bond wires, the first stud bumps, the second stud bumps, and the third stud bumps may include a copper material. The method may further comprise: removing the carrier from the bottom side of the semiconductor package exposing a portion of the first stud bumps; and after removing the carrier, applying a passivation material to the bottom side of the package covering the exposed first surface of the semiconductor die and portion of the first stud bumps. The method may further comprise patterning an opening in the passivation material to allow electrical connectivity to one or more first stud bumps.

In yet another embodiment, there is provided, a semiconductor package, comprising: a semiconductor die having a bonding pad; a bond wire electrically connecting the bonding pad to a stud bump separate from the semiconductor die; an encapsulation material encapsulating the semiconductor die, the stud bump, and the bond wire, wherein a portion of the stud bump is exposed through the encapsulation material; and a solder ball formed at the exposed portion of the stud bump. The encapsulation material may be a semiconductor epoxy mold compound. The bond wire may be an insulator coated bond wire.

FIG. 1 through FIG. 5 illustrate a method for assembling a semiconductor package in accordance with an embodiment.

FIG. 1 illustrates a cross-sectional view of carrier 10 used in the manufacture of a packaged semiconductor device. In one embodiment, carrier 10 is formed from a metal plate formed from a metal suitable for being wire bonded, such as for example, copper (Cu). In another embodiment, the carrier sheet, or plate, may be formed from a non-metal material, such as a polymer, and coated with a material that can be wire bonded. In yet another embodiment, the carrier sheet may be formed from steel between about 100 and 300 microns thick and plated with a material that can be wire bonded. Carrier 10 is divided into a plurality of package sites, where one package site is illustrated throughout the drawings for purposes of simplicity and clarity. A plurality of stud bumps is formed on the surface of carrier 10, for example, stud bumps 12, 13, and 14.

The stud bumps are spaced apart in a pattern to match a corresponding pattern on, for example, a printed circuit board. The stud bumps are preferably formed of a copper material. However, other conductive materials, such as gold (Au) or the like, may be used as well. The use of stud bumps is advantageous for electrical connection to a semiconductor die and to a printed circuit board. The stud bumps may be formed by a conventional technique, wherein shaped metallic material is bonded to the surface of carrier 10, in a manner similar to wire bonding, but the wires (not shown) are each cut closely above the bonded material to form the studs. In one embodiment, a copper wire bond wire having a diameter of about 75 microns is used to form the stud bumps. Bonding the 75 micron diameter wire may produce a stud bump having a diameter of about 225 microns. The stud bumps including stud bumps 12, 13, and 14 are formed in a pattern and spacing dictated by the terminals requiring connection.

Figure 2:
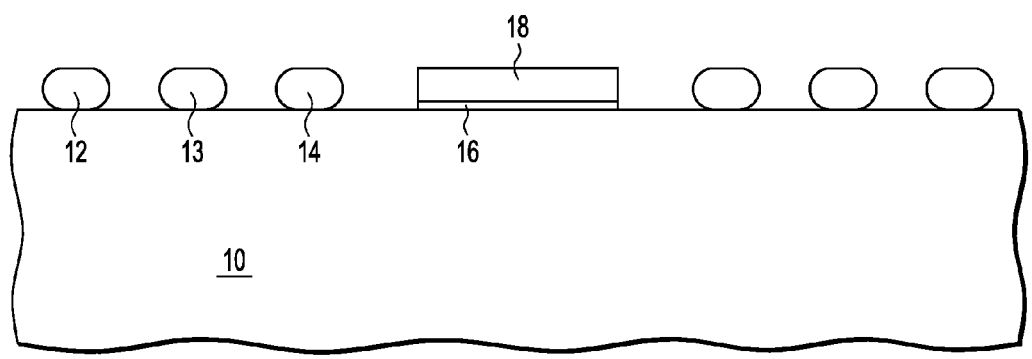

FIG. 2 illustrates a cross-sectional view of carrier 10 after the plurality of stud bumps are made to be coplanar. The stud bumps are made to be coplanar, or to have the same height, by either grinding or by "coining". When grinding, the stud bumps can be ground to flatten and smooth the top surfaces so an interconnection can be formed on the top surfaces. In coining, pressure is applied to the bumps with a tool to flatten them slightly. Die attach material 16 is deposited on semiconductor die 18, or the semiconductor wafer from which die 18 is derived (not shown), and semiconductor die 18 is then positioned in the package site of carrier 10. The die attach material may be a thermoplastic material or a B stage cured epoxy. The die attach material may be in a film or paste form. Because carrier 10 will be removed later, it is not necessary or desirable that the die attach form a strong bond. Alternately, the die attach material may be first deposited on carrier 10 and semiconductor die 18 positioned on the die attach material.

Figure 3:
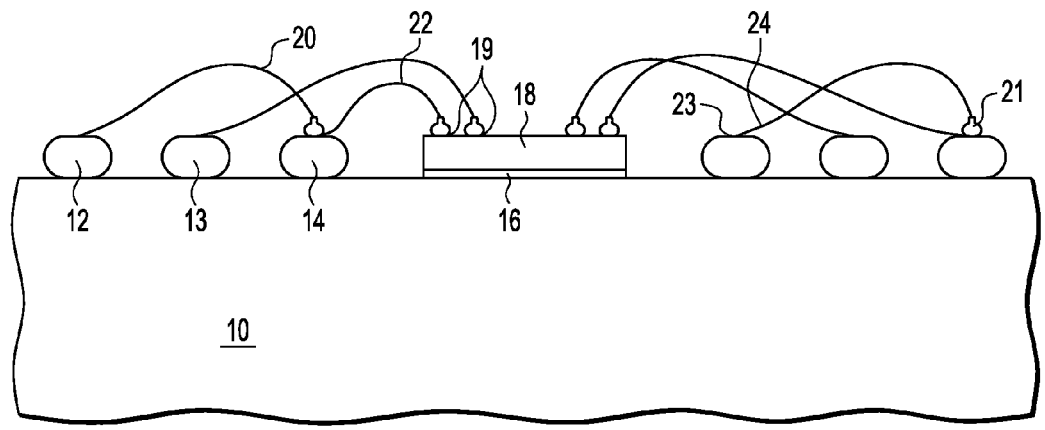

FIG. 3 illustrates a cross-sectional view of carrier 10 and semiconductor die 18 after wire bonds are formed on stud bumps and die 18. Wire bonding is used to provide electrical connections between a plurality of wire bonding pads 19 of semiconductor die 18 and flattened stud bumps including flattened stud bumps 12, 13, and 14. The wire bonds, such as wire bonds 20, 22, and 24, may also be used to form interconnects between stud bumps. Conventional wire bond techniques are used to form the wire bonds. Preferably the bond wire is formed from copper. Alternately, the bond wire may be gold, silver, or aluminum. The height of the wire bond loops should be controlled depending on the height of the encapsulant that is formed over the bond wires (illustrated in FIG. 4 and described later). In one embodiment, the bond wire used in the wire bonding is an insulator coated bond wire. The use of insulated wire makes wiring easier because two touching insulated wires do not necessarily create an electrical short. In another embodiment, bond wires without insulation may be used with careful bond wire placement. The electrical connections can be formed in various ways. For example, a bond wire 22 may be wire bonded between one of pads 19 of die 18 and one of the stud bumps, for example, stud bump 14. The wire may originate on one of the pads 19 of semiconductor die 18 with a conventional ball bond, and end at a stud bump with a conventional stitch bond. Also, as an example of a stud bump-to-stud bump interconnect, wire 20 may originate on one of the stud bumps, for example stud bump 14 with a ball bond, and end on another stud bump, for example stud bump 12, with a stitch bond. In addition, a wire 24 may begin with a ball bond 21 on a stud bump at a periphery of the pattern of stud bumps and end with a stitch bond 23 on another stud bump close to a center of the pattern of stud bumps. A stud bump may have multiple wire bond terminations. For example, stud bump 14 has a stitch bond from the end of bond wire 22 and a ball bond from the beginning of bond wire 20. Alternately, wedge bonding, ribbon bonding, or the use of soldered metal interconnects, such as for example, copper clip may be used.

Figure 4:
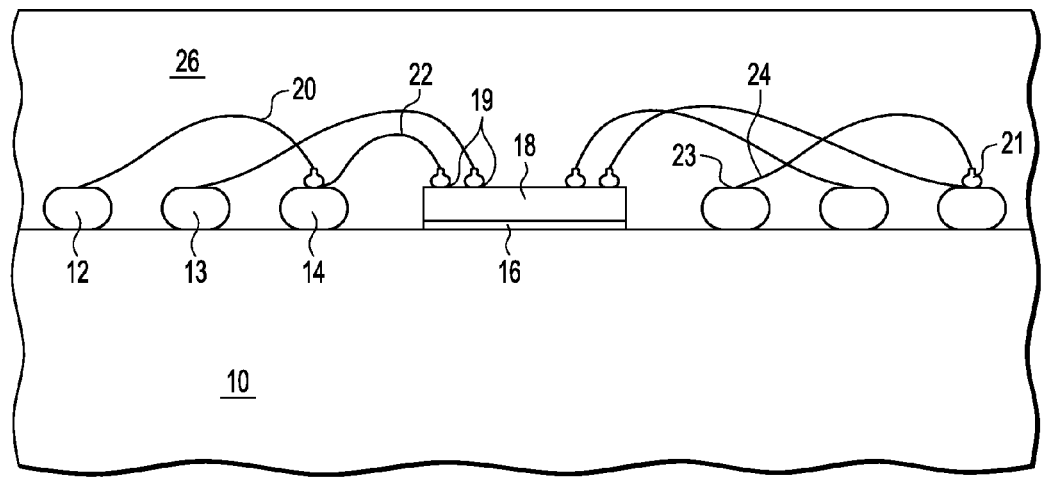

FIG. 4 illustrates a cross-sectional view of the packaged semiconductor device after an encapsulant 26 is formed over and on the surface of carrier 10, bond wires, stud bumps, and die 18. Encapsulant 26 may be formed using any suitable material and any encapsulation process including transfer molding, compression molding, or the use of a film mold compound or liquid encapsulant to provide complete coverage. In one embodiment, the encapsulant is a conventional semiconductor epoxy mold compound.

Figure 5:
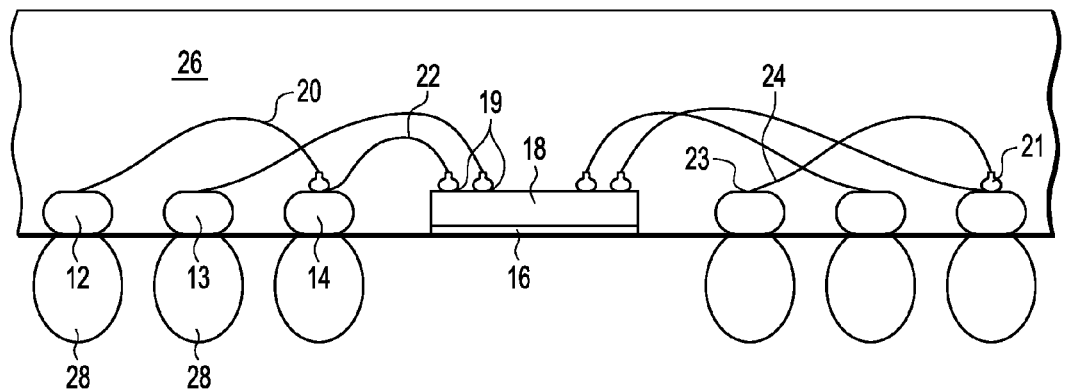

FIG. 5 illustrates a cross-sectional view of the packaged semiconductor device after carrier 10 is removed from encapsulant 26 and die 18. In one embodiment, carrier 10 is removed by etching, or dissolving. In another embodiment, carrier 10 is peeled away from the packaged semiconductor device. Alternately, carrier 10 may be removed by grinding. Carrier 10 may be reusable, further lowering the cost of assembling the packaged semiconductor device. A plurality of solder balls 28 are formed on the exposed sides of the plurality of flattened stud bumps and the individual package sites are singulated by sawing. The solder balls 28 may be formed using any conventional method. In other embodiments, the individual package sites may be singulated using a water jet or a laser. The encapsulant 26 with bond wires provides the only structure and interconnects for a packaged semiconductor device. The use of an expensive substrate with lithographically formed interconnects is avoided.

FIG. 6 through FIG. 13 illustrate a method for assembling a semiconductor package in accordance with another embodiment. This embodiment provides package connections in the form of solder balls or lands to be formed on the package surface that overlies die 18 and differs from the previous embodiment that provides a ball grid array (BGA) or land grid array (LGA) package without package connections on the package surface overlying or underlying either side of die 18, as shown in FIG. 5.

Figure 6:
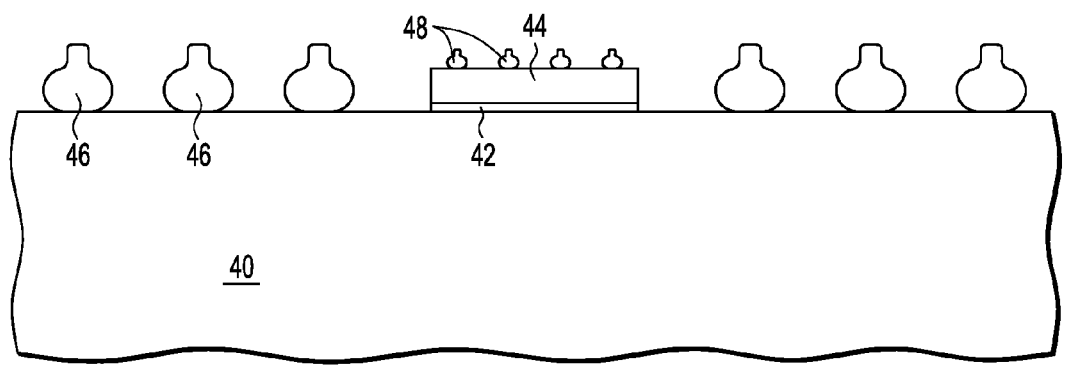
FIG. 6 through FIG. 13 illustrate a method for assembling a semiconductor package in accordance with another embodiment.

FIG. 6 illustrates a cross-sectional view of a packaged semiconductor device after a plurality of stud bumps 46, die attach 42, semiconductor die 44, and a plurality of stud bumps 48 are formed on carrier 40. A plurality of stud bumps 48 are formed on die 44. Die attach 42 is deposited on die 44 and die 44 is positioned on carrier 40. The plurality of stud bumps 46 are wire bonded to carrier 40 and the plurality of stud bumps 48 are wire bonded to pads on semiconductor die 44. In one embodiment, carrier 40 is a metal plate formed from a metal suitable for being wire bonded, such as for example, copper (Cu). In another embodiment, the carrier sheet, or plate, may be formed from a non-metal material and coated with a material that can be wire bonded. In yet another embodiment, the carrier sheet may be steel between about 100 and 300 microns thick that is plated with a material that can be wire bonded. Carrier 40 is divided into a plurality of package sites, where one package site is illustrated throughout the drawings. In the illustrated embodiment, the plurality of stud bumps 46 is wire bonded on the surface of carrier 40.

The stud bumps 46 are spaced apart and arranged in a pattern to match a corresponding pattern to which the semiconductor device is to be connected. In one embodiment, the stud bumps 46 are formed of a material comprising copper (Cu). However, other conductive materials, such as gold (Au), or the like, may be used as well. The use of stud bumps 46 is advantageous for electrical connection to a semiconductor die and to a printed circuit board. The stud bumps 46 may be formed by a conventional technique, wherein shaped metallic material is bonded to the surface of carrier 40, in a manner similar to wire bonding, but the wires (not shown) are each cut closely above the bonded material to form the studs. In one embodiment, a copper wire bond wire having a diameter of about 75 microns is used to form the stud bumps. Bonding the 75 diameter wire may produce a stud bump having a diameter of about 225 microns. The stud bumps 46 are formed in a pattern dictated by the terminals requiring connection on, for example, a printed circuit board.

The diameter of a bond wire, the design of the wire bonding tool, and the process parameters used to create the wire bond determine the diameter and height of the wire bond ball, and therefore determines the height of the stud bumps and the surface area of the stud bump used for forming solder balls. After the wire bonding operation, the overall height of the stud bumps on the surface of the device should be within a range that can be corrected by, for example, grinding or coining so that the mounting surface will be flat. In another configuration, the stud bumps may not be processed to be flat and coplanar with each other. In this case, the ball bonds and stitch bonds may be formed directly onto the stud bumps.

FIG. 6 illustrates an example embodiment where stud bumps 46 are larger than stud bumps 48. In the illustrated embodiment, the wire diameter used to form stud bumps 46 should allow the height of larger stud bumps 46 to equal or exceed the combined height of the mounted die and the height of smaller stud bumps 48 formed on the mounted die 44. Therefore, a smaller diameter wire is used to form stud bumps 48 on the semiconductor die 44 than is used to form stud bumps 46 on carrier 40. Also, note that the center-to-center spacing of the stud bumps, or pitch, is also an important consideration when determining wire diameter. A smaller pitch may require a smaller diameter bond wire. In FIG. 6, a pitch between stud bumps 46 may be different than a pitch between smaller stud bumps 48. Another embodiment may result in a full array of connections to the final packaged semiconductor device where the connections are arranged in a uniform and consistent pitch, where the pitch of larger stud bumps 46 is the same as the pitch of at least a portion of the smaller stud bumps 48 formed on die 44.

Die attach material 42 is deposited on semiconductor die 44, or the semiconductor wafer from which die 18 is derived (not shown), and semiconductor die 44 is then positioned in the package site of carrier 40. The die attach material may be a thermoplastic material or a B stage cured epoxy. Alternately, the die attach material may be first deposited on carrier 10 and semiconductor die 44 positioned on the die attach material. Stud bumps 48 are formed on wire bond pads of semiconductor die 44. Stud bumps 48 are formed using the same method described above for stud bumps 46, except stud bumps 48 are formed using a smaller diameter bond wire. In the illustrated embodiment, stud bumps 48 are formed using a 20 micron diameter wire. A resulting stud bump may have a diameter of about 50 microns. Other wire sizes may be used, and other stud bump diameters may be formed. In the illustrated embodiment, stud bumps 48 use a smaller diameter wire and are smaller than stud bumps 44.

Figure 7:
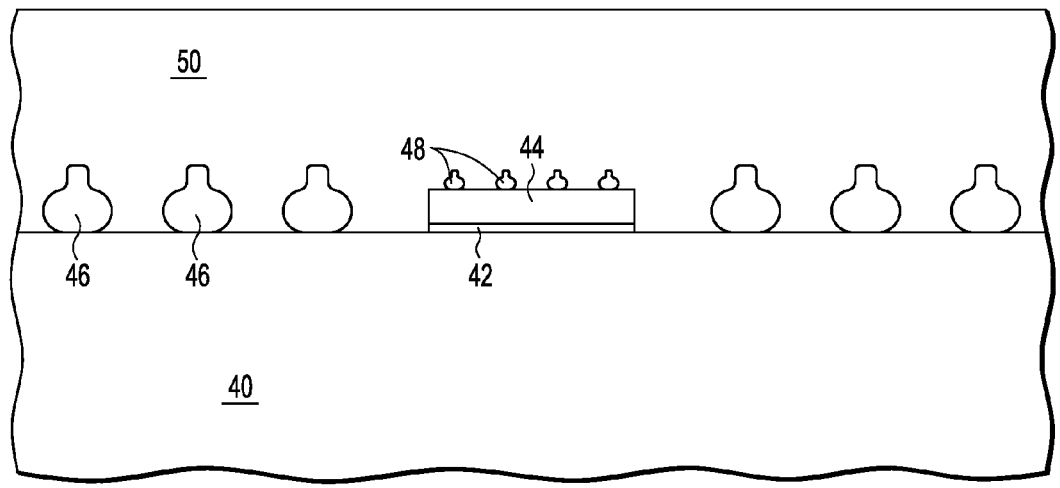

FIG. 7 illustrates a cross-sectional view of the packaged semiconductor device after an encapsulant 50 is formed on the surface of carrier 40 including over the stud bumps and die 44. The encapsulant may be formed using any suitable material and any encapsulation process including transfer molding, compression molding, or the use of a film mold compound or liquid encapsulant to provide complete coverage. In one embodiment, the encapsulant is a conventional semiconductor epoxy mold compound. Alternately, the step of forming encapsulant 50 and then grinding encapsulant 50, as discussed below, may be omitted and the process may continue as otherwise discussed below.

Figure 8:
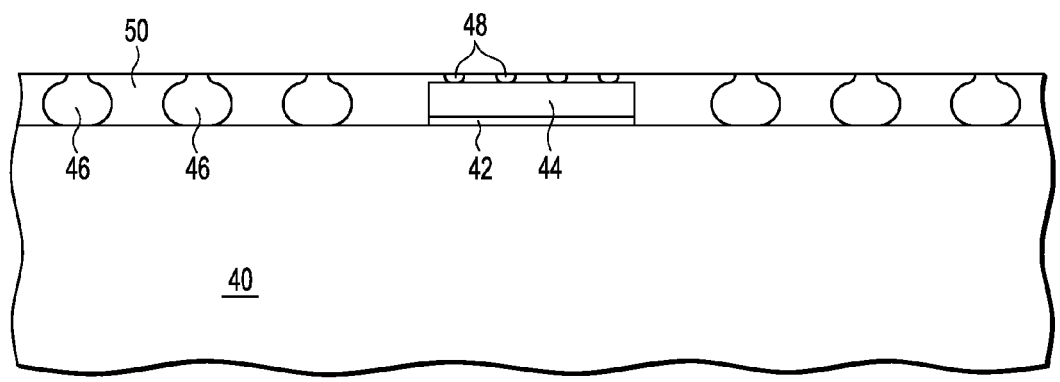

FIG. 8 illustrates a cross-sectional view of the packaged semiconductor device after grinding encapsulant 50 until exposed surfaces of stud bumps 46 and 48 have a desired diameter to produce flattened stud bumps 46 and 48, respectively. The stud bumps are flattened to provide a relatively flat top surface for wire bonding, and the like. The grinding will also have the effect of leveling and equalizing the heights of all of the bumps, if necessary.

Figure 9:
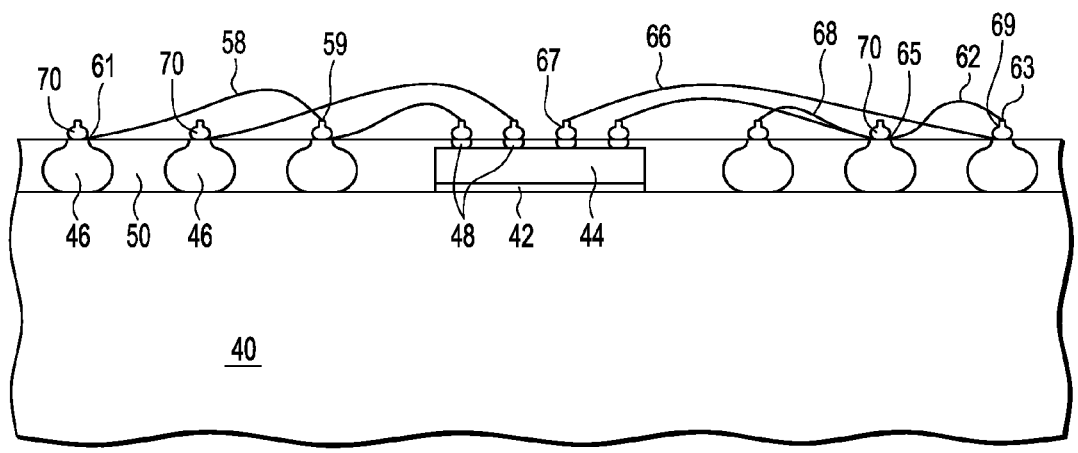

FIG. 9 illustrates a cross-sectional view of the packaged semiconductor device after wire bonding wires to the pluralities of stud bumps 46 and 48. The wire bonding is used to provide electrical connections between wire bonding pads of semiconductor die 44 and stud bumps 46. In one embodiment, the bond wire used for wire bonding is an insulator coated bond wire. Preferably the bond wire is formed from copper. Alternately, the bond wire may be gold, silver, or aluminum. The use of insulated wire makes wiring easier because two touching wires do not necessarily create an electrical short. In another embodiment, bond wires without insulation may be used with careful wire placement. The electrical connections can be formed in various ways. For example, a bond wire 58 may originate at a ball bond 59 and end at a stitch bond 61. Also, a wire bond 66 may originate at a ball bond 67 formed on flattened stud bump 48 on die 44 and end at a stitch bond 69 on one of stud bumps 46. In addition, a wire bond 62 may originate at a ball bond 63 and end at a stitch bond 65. In FIG. 9, some of the stud bumps may not have ball bonds formed thereon after wire bonding is complete. If this is the case, then additional stud bumps may be added. In FIG. 9, additional small stud bumps 70 are formed to equalize the height of the stacks of stud bumps. In addition to correcting stud bump stack height, the additional stud bumps may function as security bonds for the stitch bonds. As discussed above, different wire diameters are used for the stud bumps depending on desired stud bump height and pitch. A larger wire diameter will generally result in a taller, or higher, stud bump. The illustrated embodiment uses ball bonds and stitch bonds for the wire bonds between stud bumps. Alternately, wedge bonding, ribbon bonding, or the use of soldered metal interconnects, such as for example, copper clip may be used for the wire bonding. The loop heights of the wire bonds should be managed depending on the overall height of the package. If a thin profile package is desired, then a low wire loop height should be used. In another configuration, the molding operation used to create the structure shown in FIG. 7 may be later in the process flow. Also, the grinding operation used to expose a portion of stud bump 46 and 48 may be eliminated. In this case, the wire bonding illustrated in FIG. 9 would be performed by creating the ball bonds 59 and stitch bonds 61 directly on top of stud bumps 46 and 48 shown in FIG. 6. This simplified process eliminates the molding operation illustrated in FIG. 7, and the grinding operation illustrated in FIG. 8.

Figure 10:
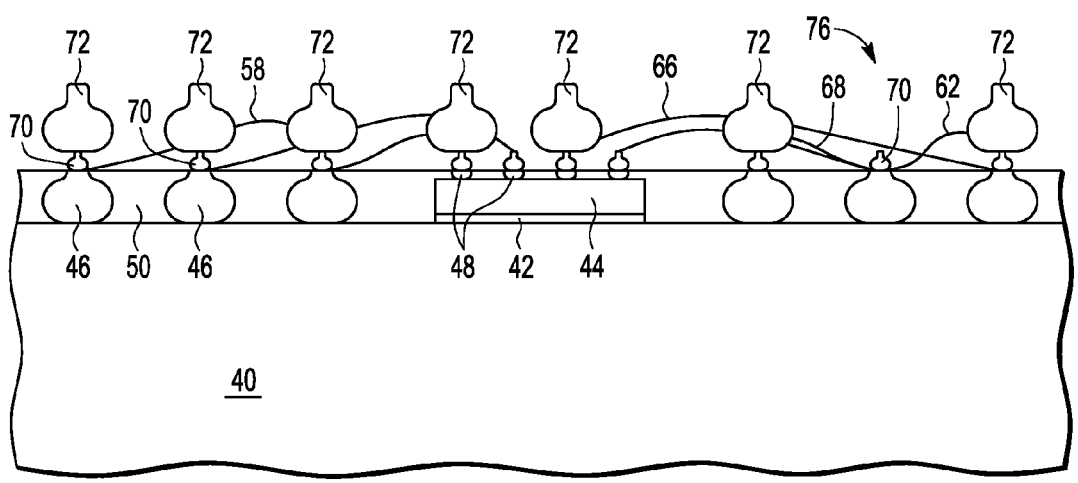

FIG. 10 illustrates a cross-sectional view of the packaged semiconductor device after plurality of stud bumps 72 are formed on the smaller stud bumps and wire bonds including stud bumps 70. Although not illustrated in FIG. 10, stud bumps 70 may be flattened substantially in the process of forming stud bumps 72. Stud bumps 72 are formed from larger diameter wire, such as the above described 75 micron diameter bond wire. Note that stud bumps do not have to be formed in every location. For example, a stud bump is omitted from a location 76 because it is not needed or desired for making an electrical connection. The diameter of the larger stud bumps 72 is determined by the required stud height and pitch. In the illustrated embodiment, the same diameter wire is used for stud bumps 72 and stud bumps 46.

Figure 11:
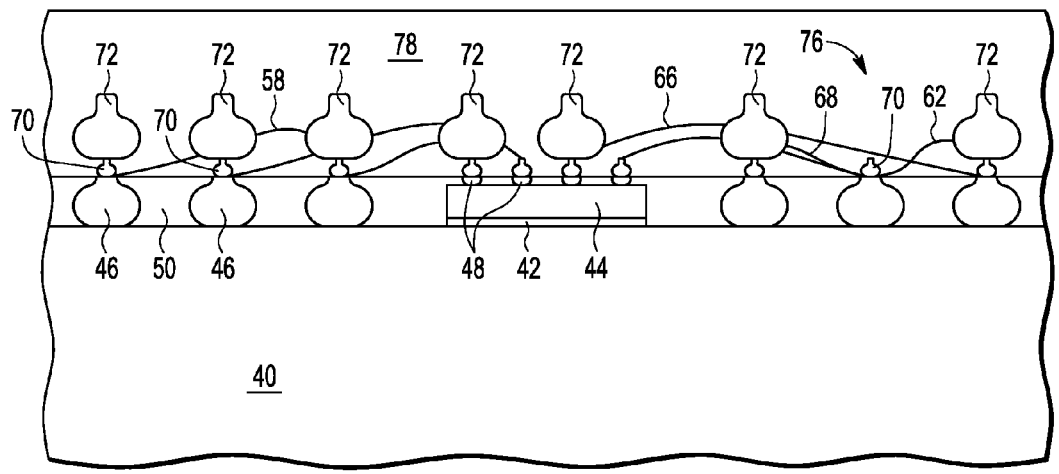

FIG. 11 illustrates a cross-sectional view of the packaged semiconductor device after an encapsulant 78 is formed. The encapsulant may be formed using any suitable material and any encapsulation process including transfer molding, compression molding, or the use of a film mold compound or liquid encapsulant to provide complete coverage. In one embodiment, the encapsulant is a conventional semiconductor epoxy mold compound.

Figure 12:
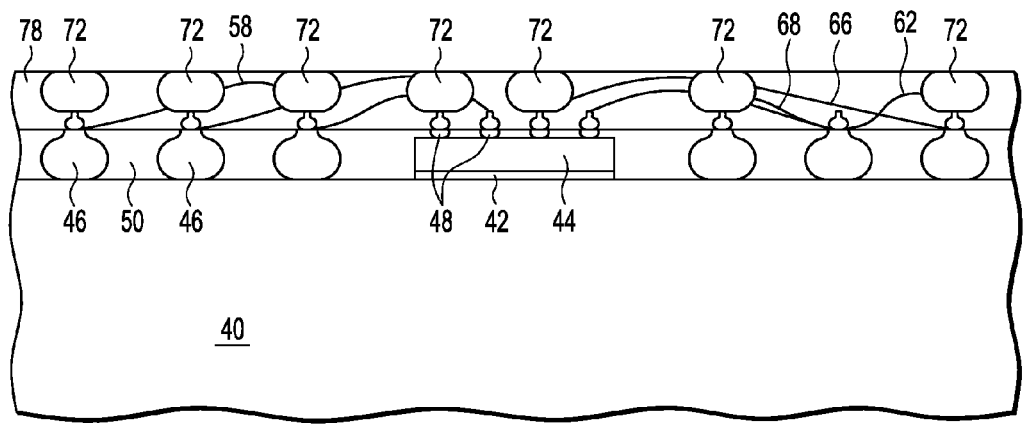

FIG. 12 illustrates a cross-sectional view of the packaged semiconductor device after grinding encapsulant 78 until exposed surfaces of stud bumps 72 have a desired diameter. The stud bumps are flattened to provide a relatively flat top surface for solder ball attach to form a ball grid array package, or for forming solder joints directly to pads on a printed circuit board when no solder balls are attached. The grinding will also have the effect of leveling the heights of the bumps, if necessary. In another embodiment, stud bumps 72 may first be flattened in a coining operation, followed by a film assisted molding process to reduce or eliminate the need for grinding.

Figure 13:
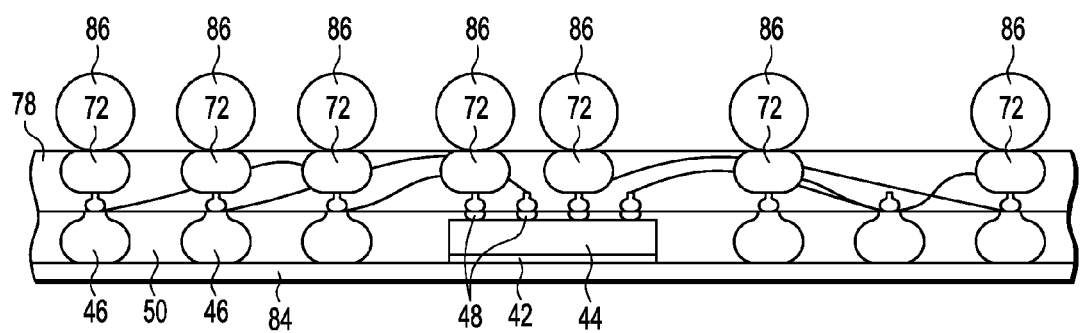

FIG. 13 illustrates a cross-sectional view of packaged semiconductor device after carrier 40 is removed from the semiconductor device. In one embodiment, carrier 40 is removed by etching. In another embodiment, carrier 40 is peeled away from the packaged semiconductor device. Carrier 40 may be a reusable carrier, further lowering the cost of assembling the illustrated and described packaged semiconductor device. Solder balls 86 are formed on the exposed flattened surfaces of stud bumps 72. Each of the package sites are then singulated by sawing. Alternately, the singulation may be by laser or water jet. Solder mask 84 is deposited on the side of the package opposite the solder balls 86. Solder mask 84 prevents electrical connection to the metal of the bottom surface of the packaged device. Alternately, solder mask 84 can be patterned to expose the surface of stud bumps 46 and to allow the stud bumps 46 to function as pads for use in a package-on-package type of application.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of assembling a semiconductor package, the method comprising:
   attaching a first surface of a semiconductor die to a carrier;
   forming one or more first stud bumps on the carrier;
   forming one or more second stud bumps on a second surface of the semiconductor die;
   molding the semiconductor die, the first stud bumps, and the second stud bumps in a first encapsulation material;
   exposing a to portion of the first stud bumps and second stud bumps through the first encapsulation material;
   using bond wires, connecting the exposed to portion of one or more first stud bumps to the exposed to portion of one or more second stud bumps; and
   removing the carrier from the bottom side of the semiconductor package exposing a bottom portion of the first stud bumps.

2. The method of claim 1, further comprising electrically connecting two first stud bumps to each other using a bond wire.

3. The method of claim 1, wherein the bond wires include a copper material, a gold material, a silver material, or an aluminum material.

4. The method of claim 1, wherein the bond wires are insulator coated bond wires.

5. The method of claim 1, wherein the bond wires include a ball bond on a first end and a stitch bond on a second end.

6. The method of claim 1, wherein attaching the first surface of the semiconductor die to the carrier includes applying a die attach paste material to the carrier or a die attach film to the first surface of the semiconductor die.

7. The method of claim 1, further comprising forming one or more third stud bumps on top of one or more bond wire ends.

8. The method of claim 7, further comprising:
molding the bond wires and third stud bumps in a second encapsulation material; and
exposing a portion of the third stud bumps through the second encapsulation material.

9. The method of claim 8, further comprising attaching one or more solder balls to the exposed portion of the third stud bumps.

10. A method of assembling a semiconductor package, the method comprising:
attaching a first surface of a semiconductor die to a carrier;
forming one or more first stud bumps on the carrier;
forming one or more second stud bumps on a second surface of the semiconductor die;
molding the semiconductor die and the first and second stud bumps in a first encapsulation material;
exposing a portion of the first and second stud bumps through the first encapsulation material;
using bond wires, electrically connecting the exposed portion of one or more first stud bumps to the exposed portion of one or more second stud bumps;
forming a third stud bump on top of one or more bond wire ends;
molding the bond wires and third stud bumps in a second encapsulation material;
exposing a portion of the third stud bumps through the second encapsulation material; and
attaching one or more solder balls to the exposed portion of the third stud bumps.

11. The method of claim 10, wherein the diameter of the third stud bumps is equal to or greater than the diameter of the second stud bumps.

12. The method of claim 10, wherein attaching the one or more solder balls further comprises plating the exposed portion of the third stud bumps before attaching the one or more solder balls.

13. The method of claim 10, wherein the exposing a portion of the first and second stud bumps through the first encapsulation material further comprises grinding the encapsulant until a predetermined diameter of the first and second stud bumps is exposed.

14. The method of claim 10, wherein the exposing a portion of the third stud bumps through the second encapsulation material comprises using a film-assisted molding technique.

15. The method of claim 10, wherein the bond wires, the first stud bumps, the second stud bumps, and the third stud bumps include a copper material.

16. The method of claim 10, further comprising:
removing the carrier from the bottom side of the semiconductor package exposing a portion of the first stud bumps; and
after removing the carrier, applying a passivation material to the bottom side of the package covering the exposed first surface of the semiconductor die and portion of the first stud bumps.

17. The method of claim 16, further comprising: patterning an opening in the passivation material to allow electrical connectivity to one or more first stud bumps.

18. A semiconductor package, comprising:
a semiconductor die having a bonding pad;
a first stud bump formed on the bonding pad;
a second stud bump formed separate from the semiconductor die;
an encapsulation material encapsulating the semiconductor die, the first stud bump, and the second stud bump, wherein a top portion of the first and second stud bumps and a bottom portion of the second stud bump are exposed through the encapsulation material; and
a bond wire electrically connecting the exposed to portion of the first stud bump to the exposed to portion of the second stud bump.

19. The semiconductor package of claim 18, wherein the bond wire is an insulator coated bond wire.

20. The method of claim 18, further comprising a third stud bump formed on top of at least one bond wire end.

* * * * *